(12) United States Patent
Miller et al.

(10) Patent No.: US 8,723,119 B2
(45) Date of Patent: May 13, 2014

(54) ELECTRIC GENERATOR EXCITED BY IONIZING RADIATIONS

(75) Inventors: Florent Miller, Levallois (FR); Nadine Buard, Mendon (FR); Antonin Bougerol, Suresnes (FR); Cécile Weulersse, Versailles (FR)

(73) Assignee: European Aeronautic Defence and Space Company Eads France, Paris (FR)

( * ) Notice: Subject to any disclaimer, the term of this patent is extended or adjusted under 35 U.S.C. 154(b) by 209 days.

(21) Appl. No.: 13/140,414

(22) PCT Filed: Dec. 2, 2009

(86) PCT No.: PCT/FR2009/052379
§ 371 (c)(1),
(2), (4) Date: Aug. 30, 2011

(87) PCT Pub. No.: WO2010/076449
PCT Pub. Date: Jul. 8, 2010

(65) Prior Publication Data
US 2011/0298332 A1 Dec. 8, 2011

(30) Foreign Application Priority Data
Dec. 17, 2008 (FR) ...................................... 08 58715

(51) Int. Cl.
*G01J 1/00* (2006.01)
*G21H 1/06* (2006.01)

(52) U.S. Cl.
CPC ........................................ *G21H 1/06* (2013.01)
USPC ....................................................... 250/336.1

(58) Field of Classification Search
CPC ........................................................ G21H 1/06
USPC ....................................................... 250/336.1
See application file for complete search history.

(56) References Cited

U.S. PATENT DOCUMENTS

| | | | | |
|---|---|---|---|---|
| 3,529,161 A | * | 9/1970 | Kok et al. | 250/370.1 |
| 3,777,147 A | * | 12/1973 | Hoyer et al. | 250/264 |
| 4,032,363 A | * | 6/1977 | Raag | 136/211 |
| 4,419,532 A | * | 12/1983 | Severns | 136/253 |
| 4,572,954 A | * | 2/1986 | Josephson et al. | 250/370.07 |
| 4,804,847 A | * | 2/1989 | Uber, III | 250/389 |
| 4,818,884 A | * | 4/1989 | Saubolle | 250/388 |
| 4,857,739 A | * | 8/1989 | Phelps | 250/388 |

(Continued)

OTHER PUBLICATIONS

Author: Nafaa Reguigui, Title: Gamma Ray Spectrometry, Date: Sep. 2006.*

(Continued)

*Primary Examiner* — David Porta
*Assistant Examiner* — Taeho Jo
(74) *Attorney, Agent, or Firm* — Im IP Law PLLC; C. Andrew Im

(57) ABSTRACT

The invention relates to an electric generator sensitive to ionizing radiation produced by the reverse mounting of a diode in parallel between a reverse polarization stack and a pulse converter or only with a pulse converter. A generator is thus provided that can be used inside a spacecraft or in the atmosphere by using cosmic radiation, or in an environment containing ionizing radiation such as in the medical or nuclear fields, and which is preferably directly mounted on a printed circuit board receiving a remote sensor.

8 Claims, 3 Drawing Sheets

(56) References Cited

U.S. PATENT DOCUMENTS

| | | | |
|---|---|---|---|
| 5,376,798 A | 12/1994 | Pettit | |
| 5,767,592 A * | 6/1998 | Boys et al. | 307/108 |
| 6,118,204 A * | 9/2000 | Brown | 310/303 |
| 6,166,317 A * | 12/2000 | Volk, Jr. | 136/201 |
| 6,747,278 B1 * | 6/2004 | Campione | 250/387 |
| 6,949,962 B2 | 9/2005 | Arques | |
| 8,072,595 B1 * | 12/2011 | Bastiaans et al. | 356/301 |
| 2002/0001746 A1 * | 1/2002 | Jenson | 429/162 |
| 2004/0113084 A1 * | 6/2004 | Nakata et al. | 250/370.01 |
| 2004/0129888 A1 * | 7/2004 | Kannan et al. | 250/370.07 |
| 2005/0227493 A1 * | 10/2005 | Lin et al. | 438/700 |
| 2006/0181905 A1 * | 8/2006 | Summer | 363/21.12 |
| 2006/0255276 A1 * | 11/2006 | Manneschi | 250/339.12 |
| 2008/0161697 A1 * | 7/2008 | Chance | 600/473 |
| 2011/0209744 A1 * | 9/2011 | Hu | 136/248 |

OTHER PUBLICATIONS

S. Cecchini et al., "Solar panels as air Cherenkov detectors for extremely high energy cosmic rays," Sixth topical Seminar on Neutrino and Astroparticle Physics, Nucl. Phys. Proc. Suppl., No. 85, May 17, 1999, pp. 332-337, San Miniato, Italy.

* cited by examiner

ELECTRIC GENERATOR EXCITED BY IONIZING RADIATIONS

RELATED APPLICATIONS

This application is a §371 application from PCT/FR2009/052379 filed Dec. 2, 2009, which claims priority from French Patent Application No. 08 58715 filed Dec. 17, 2008, each of which is herein incorporated by reference in its entirety.

TECHNICAL FIELD OF THE INVENTION

The purpose of the present invention is an electric generator excited by ionizing radiations external to the generator, whether of natural origin such as cosmic radiation or present in certain specific environments such as the nuclear or medical fields. The generator of the invention contains a diode that produces electrical energy from the ionizing radiations. Made of a semiconductor material that recovers the energy released by the electrons generated by Coulombian effects, the generator is capable of delivering electricity and has a lifespan of several decades.

BACKGROUND OF THE INVENTION

The concept of the nuclear battery has been known since the work of Philip Edwin Ohmart in 1951. Cells of this type, the most current nuclear or beta voltaic cells, consist of a tritium doped diode, a radioactive isotope of hydrogen, and use a non-thermal conversion process. This dopant emits ionizing radiation in the diode itself. The diode then produces a corresponding electrical current. The inconvenience of this technology is that it involves handling radioactive materials.

In addition, the generator of the invention is different from photovoltaic cells with a diode base in that it does not need to be exposed to the photonic radiation of the Sun, in direct light. On the contrary, it can be placed inside a craft, typically a spacecraft or aircraft, and thereby continue to be protected from mechanical projections whilst continue to produce electricity.

In the invention, the solution proposed is to use as a source of energy the natural radiative environment or any other ionizing radiative environment, and not a radioactive isotope present in the generator.

The radiative environment with a cosmic origin comes from the Sun (solar wind and eruptions) and from interstellar and intergalactic space which permanently emits very varied natural energy particles: cosmic rays. This includes the part charged mainly with protons (between 85% and 90%) and helium nuclei (between 9% and 14%), with the remainder consisting of electrons, various nucleons (atomic nuclei) as well as small quantities of light anti-matter (antiprotons and positrons). The neutral part consists of gamma rays as well as neutrinos.

The terrestrial magnetic field diverts the major part of these cosmic rays. A significant proportion of the protons and electrons are trapped around the field lines, forming a region commonly called a radiation belt. The other part, under a process of spallation from heavier nuclei present in the atmosphere, produces secondary or tertiary ionizing radiation and particles (neutrons, photons, pions, muons, electrons, alpha ions . . . ). This phenomenon is called atmospheric cascade. FIG. 1 shows such a cascade taking place at altitudes of between 35 km and 0 km from the Earth's surface.

Consequently, between the upper layer of the atmosphere and sea level, the formation of particles is variable. Nevertheless, the flow of secondary charged particles is reduced because of their interaction with the molecules present in the atmosphere. The result is a predominance of neutrons at aircraft flying altitudes.

The neutron flow present in the atmosphere varies according to latitude and altitude, and doubles at 1,500 m altitude compared with ground level. It also varies under the effects of changes in solar activity.

In addition to the natural radiative environment of cosmic origin, a component at ground level comes from the natural activity of the ground produced by radioactive substances such as uranium, thorium or potassium-40. These emit gamma and beta rays. Other environments with ionizing radiation are civil nuclear plants and the military nuclear and medical fields.

OBJECT AND SUMMARY OF THE INVENTION

According to the invention, the diode used is a diode that is either reverse polarized, or non-polarized, and is also coupled to a pulse transformer. The aim of the reverse polarization of the diode is to increase the depletion zone of the diode, and therefore to favor, before re-combination, the collection of electron-hole pairs created by the electrically charged ionizing particles.

The pulse transformer, for example a high-frequency magnetic transformer with high transformation ratio, transforms the current pulse into a high-voltage pulse exploited downstream.

Therefore, the purpose of the invention is an electrical generator excited by ionizing radiation, characterized by having an electrical device with semiconductor junction, non-polarized or reverse polarized, and connected to a pulse transformer.

Therefore, the purpose of the invention is an accumulator consisting of diode of silicon or any other semi-conducting material, that is, a p-n junction linked to two electrodes, using an ohmic contact, and an electronic circuit, the transformer. The generator transforms low-level ionizing radiation into electricity using the generation of current in the diode.

The efficiency of a semi-conducting detector depends on numerous factors such as: the type and energy of the incident radiation, its geometry, the density and the atomic number of the material used, any dead zones resulting from the transportation properties of the carriers and the signal induction mechanism. For the choice of semiconductor material, a large number of parameters are used, such as: the mobility of the carriers, the intrinsic resistance, the ionizing energy . . . , the aim being to maximize the energy deposited per unit of length and the proportion of the energy collected, that is, the efficiency.

BRIEF DESCRIPTION OF THE DRAWINGS

The invention will be more easily understood by reading the following description and examining the accompanying figures. These are presented for indicative purposes only and do not in any way limit the invention. The figures show the following.

DETAILED DESCRIPTION OF THE EMBODIMENTS

Figure 1:
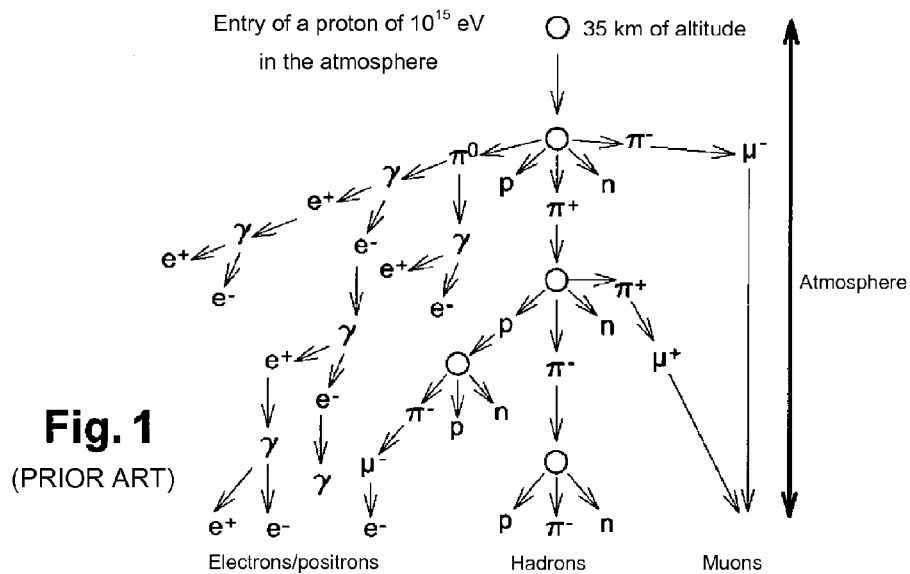
FIG. 1: already commented upon, a diagram of an atmospheric cascade produced by a proton.
Figure 2:
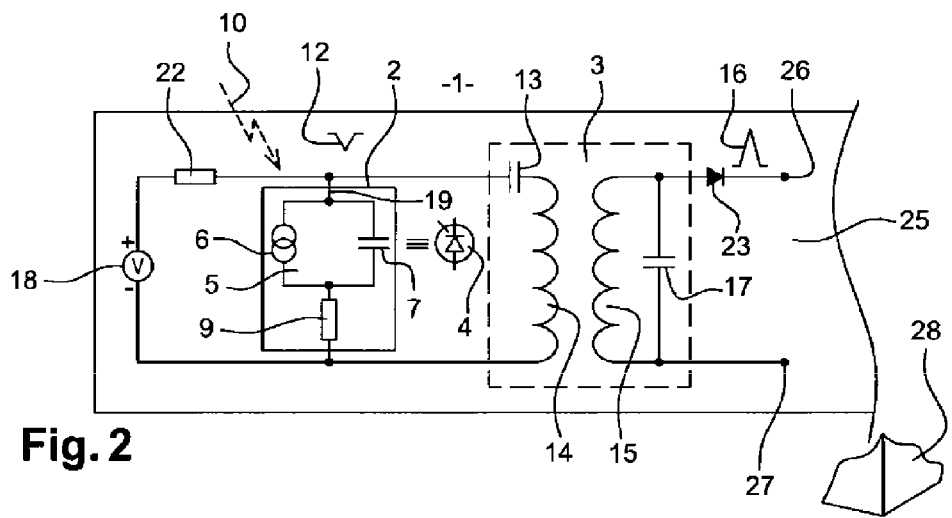
FIG. 2: a diagrammatic representation of the generator of the invention.

FIG. 2 shows a diagrammatic representation of the generator 1 of the invention. The generator 1 comprises an electronic device 2 with a semiconductor junction connected to a pulse transformer 3. The device 2 comprises a semiconductor junction 4, represented by its equivalent electrical diagram 5. According to this diagram 5, the junction 4 comprises a leaking current generator 6, in parallel with a condenser 7 representing a junction capacity, and a resistor representing the junction resistance. Typically, the capacity 7 has a value of several pF, for example 80 pF, with the resistance having a very high value, for example several MΩ (megohms). The equivalent diagram is added to by a low-value base resistor 9. Where the device 2 is subject to cosmic radiation 10, it produces a current pulse 12, negative here, of low amplitude.

The transformer 3 is preferably connected to the device 2 using a condenser 13, which is useful for preventing a DC component from passing into the transformer 3, causing needless energy losses and possibly contributing to saturating the nucleus of the transformer 3. The transformer 3 is a magnetic transformer with primary 14 and secondary 15 windings correctly wound to produce a pulse 16 with a positive polarity chosen. Preferably, the transformer 3 should include in parallel on the secondary winding 15 a resonance condenser 17 to tune the transformer 3 to a pulse 16 issue frequency. A set of rectifier diodes such as 23 allows the pulse 16 to be rectified and transformed with the aid of the condenser 17, as a DC component. The transformer plays a rectifier role and as a converter to convert the current pulse into voltage.

The semiconductor junction 4 of the generator 1 can be reverse polarized if a supply of several dozen volts is conceivable with the system and if the final energy performance rating remains positive. In one example, this reverse polarity can be simulated by a battery 18 connected in parallel to the diode 4. The positive pole of the battery 18 is connected to the cathode of the diode 4, with the negative pole being connected to the anode. With this reverse polarity, the width of the junction is increased. To avoid a reverse leaking current and discharging the battery 18, the battery 18 can be mounted in series with a diode polarized directly, that is, with the cathode of the diode connected to the negative pole of the battery 18, and its anode connected, indirectly, to the positive pole of the battery 18. In most cases, the supply from the battery 18 can done without, and the junction 4 will then not be polarized and will possess a less extensive depletion zone. The efficiency will represent about 15% of the efficiency corresponding to a total depletion zone. The battery 18 is connected to the junction 4 by a resistor 22 minimizing the effects of the current pulses 11 on the battery 18. So the diode 4 is here connected between the resistor 22 and the anode of the diode 21.

Polarization or its absence can depend upon the desired use.

The generator of the invention should preferably be used with a diode 4 mounted on an electronic circuit board 25, not shown, but supplied by the generator 1, at the terminals 26 and 27 downstream of the diodes 23 and 24. The electronic board 25 can be contained in a case 28 shielded against photonic radiations. For example, it is mounted inside a spacecraft or aeronautical craft. The board 25 has and in particular is used to supply a sensor of vibrations, temperature, radiation, inertia or other field, carried in the craft, without the need to bring the supply wires to the sensor to supply it electrically.

In the case of ionizing radiations, whether or not by direct ionization as in the case of charged particles (protons, heavy ions, muons, pions) or by indirect ionization, namely, by the creation of secondary ions in nuclear reactions (mainly relating to protons and neutrons), they deposit their kinetic energy along their traces.

The charged particles lose their energy through Coulombian interaction with the semiconductor electrons. Electron-hole pairs are generated, with the quantity of pairs created being proportional to the energy deposited.

When a reverse polarity voltage is applied to the p-n junction, the minority charges migrate from one side to the other of the junction and the depletion zone, also called a Space Charge Zone, increases. The electric field is distributed over the whole of the depth of the depletion zone. An electron-hole pair generated in the depletion zone is then separated by this electric field: the electron reaches the cathode 19 and the hole, at the anode 20. The movement of a pair then creates an elementary charge at the electrodes of the diode. If the electron-hole pair is generated outside the depletion zone, that is, in the neutral regions, the carriers created diffuse up to the limit of the depletion zone through an ambipolar diffusion mechanism. This process is longer than in cases where the electron-hole pair is generated in the depletion zone but nevertheless is still faster than the re-combination mechanism such that the current pulse is produced in all cases. The diode is connected to an electronic circuit, the transformer 3, which allows the charges created to be recovered. The more extended the depletion zone is, the more efficient the diode becomes. The width of the depletion zone depends on the concentration of the doping agent and the reverse polarity voltage applied to the diode. It can be artificially increased by inserting an intrinsic region between the n-type and p-type regions. This leads to another type of diode: the PIN diode. If the reverse polarity of the structure is sufficient, an electrical field exists in the whole of the intrinsic zone.

When no reverse polarity voltage is applied, the collective charge is less than the charge generated, but is still sufficient to generate a current pulse to the diode terminals.

Judicious use can be made of this type of generator for systems that are difficult to access and with low consumption. It only supplies low power but has a lifespan much longer than conventional batteries since its source of energy is inexhaustible. Contrary to a battery and where the diode functions without a battery to polarize it, it does not contain any toxic element harmful to the environment: it is a healthy generator.

The use of ionizing radiation present in space, avionic, nuclear and medical environments, instead of tritium as a source of energy, has advantages regarding safety and packaging. This generator does not contain any radioactive isotope. Compared with tritium based diodes, it also has the advantage that it does not generate energy electrons that cause internal damage to the material. Compared with solar cells, it can be placed anywhere in the system, close to electricity components to be supplied, and thereby facilitate wiring.

Figure 4:
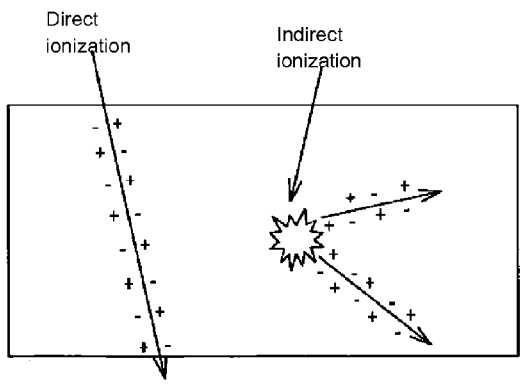
FIG. 4: a diagram showing the difference between direct and indirect ionization.
Figure 3:
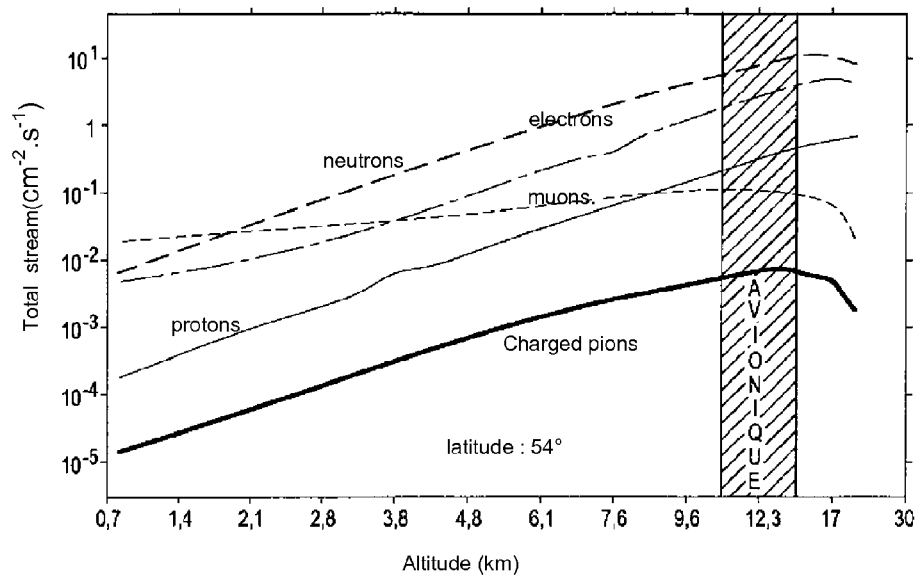
FIG. 3: a study of the total stream of particles found in the atmosphere depending on the altitude, at the altitudes considered.

The quantity of electricity generated depends on the radiative environment of the generator, namely, the stream and type of ionizing particles. These radiations are present in the atmosphere in small quantities but are a lot more numerous in space. FIG. 3 shows a study of the total stream of ionizing particles found in the atmosphere according to the altitudes, at the altitudes considered, and according to the different types of particles concerned. FIG. 4 shows that in the diode itself, nuclear reactions can occur, generating secondary ions also leading to the creation of electron-hole pairs forming a current pulse.

The ionization of the semiconductor is greater or lesser depending on the type of particles. The quantity of electron-hole pairs generated along the trace depends on the energy given off per unit of length or Linear Energy Transfer (LET), estimated in C/m, which depends on the nature of the ion, the semiconductor material and its energy.

The following paragraphs estimate the charge created where a silicon diode with surface area of 1 $cm^2$, non-polarized, and of depth of 500 µm, for various radiative environments.

Figure 5:
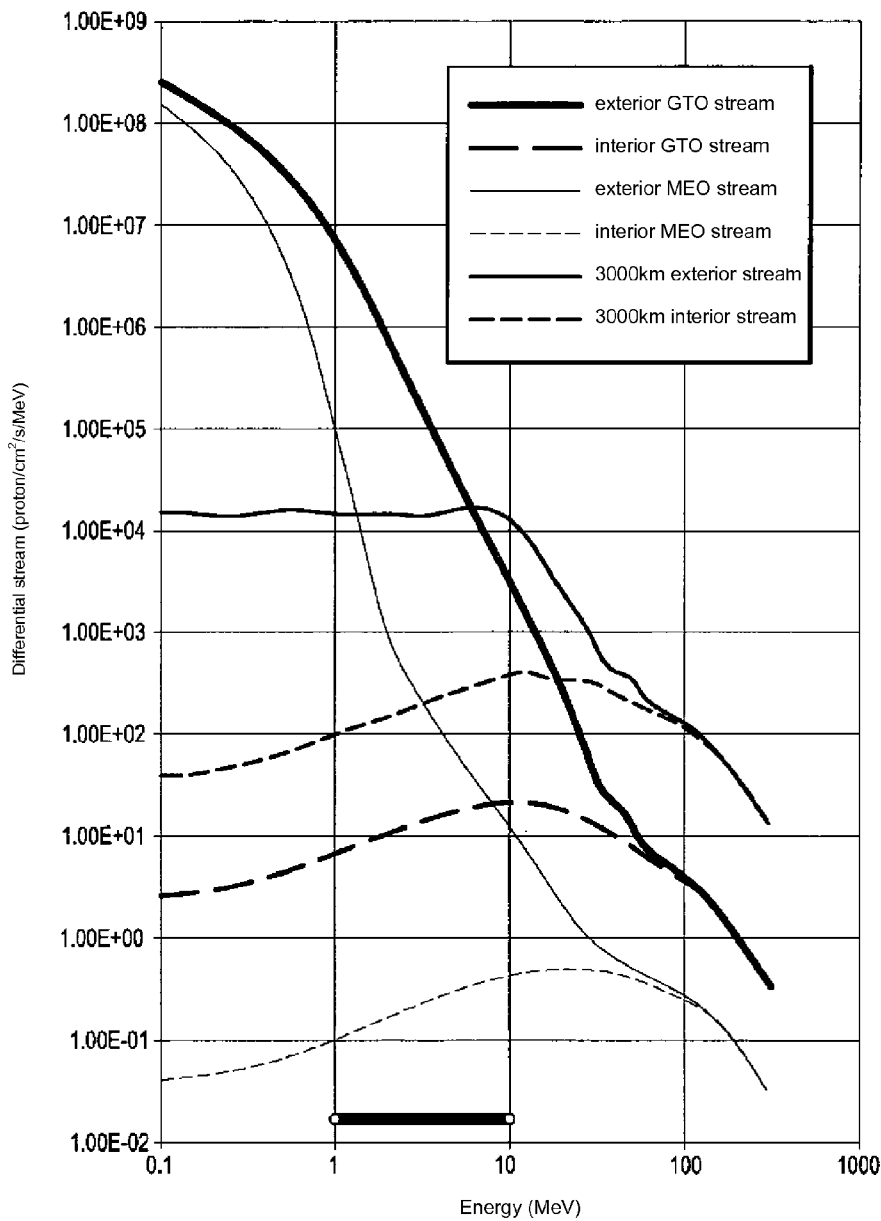
FIG. 5: a study of the proton stream in a space environment, inside and outside the vehicle, corresponding to an aluminum screen of 1 g/cm$^2$.

In a space environment, as a first approximation, only the contribution of the protons is taken into account. If the simplified hypothesis is made of the normal incidence in the junction, protons whose path is less than 500 µm will deposit all their energy in the diode. These protons correspond to energy of less than 9 MeV [mega electron volts]. Conversely, higher energy protons will deposit only a part of their energy. After calculation, it turns out that each energy proton below 9 MeV deposits between 6 fC and 60 fC. FIG. 5 gives the stream of protons according to energy for different space environments, a Medium Earth Orbit [MEO], a Geostationary Transfer Orbit [GTO] and an environment at 3,000 km altitude. FIG. 5 indicates the stream on the exterior and in the interior of the spacecraft, that is, after traversing the structure of 1 $g/cm^2$ of the spacecraft. For example, for a particle stream of between 1 and 10 MeV of 26500 $p/cm^2/s$ which corresponds to an exterior stream for an MEO environment, the total charge deposited in one hour by the protons via direct ionization (low energy protons) is 2.5×/h.

Indirect ionization, created by energy protons higher than 10 MeV, is not included in these calculations as, although the associated proton stream is twenty times higher, the deposit of charges per proton is 3,000 times weaker.

If a supply of 1 V is supposed at the terminals 26 and 27, the energy stored is 2.5 µWh, or 9 mJ. The power produced is 2.5 $\mu W/cm^2$. This power is sufficient temporarily to supply (for example ****) sensors and allows the production of 1 mW over 1 ms at a voltage of 1V every 7 minutes. The generation is of the same order of size as the recovery of energy as radiofrequency (<1 $\mu W/cm^2$) or acoustically (0.003–0.96 $\mu W/cm^3$).

Table 1 below shows the quantity of charges expected for the space environments studied, in the case of a reverse polarized diode with total depletion and in the case of a diode without polarization.

In the case of a polarized diode (for a voltage of about 40V, the diode is fully depleted), its efficiency is improved by a factor of 7. Its typical leakage current is of the order of 50 nA. Its consumption is therefore 5 µW per hour. The power produced is 17 $\mu W/cm^2$, a gain of 12 $\mu W/cm^2$.

TABLE 1

| Environment | Number of protons between 1-10 MeV | | Charges deposited if diode polarized (total depletion of 500 µm) (µC/h) | | Charges deposited if diode not polarized (µC/h) | |
| --- | --- | --- | --- | --- | --- | --- |
| | exterior | interior | exterior | interior | exterior | interior |
| MEO | 26500 | 3 | 17 | 0.003 | 2.5 | 0.0005 |
| GTO | 2700000 | 160 | 1500 | 0.16 | 230 | 0.024 |
| 3,000 km | 137000 | 2600 | 110 | 2.65 | 16 | 0.4 |

On the exterior of the craft, power levels comparable to those produced by solar cells in cloudy weather are attained (150 $\mu W/cm^2$).

For an atmospheric environment at 12 km altitude, valid for aircraft, the action of high energy neutrons, protons, muons and thermal neutrons on the Boron10 can be counted, in the case of a non-polarized diode.

The average energy deposited by a high energy neutron, higher than 10 MeV, is 0.03 fC whilst the stream is 5,000 $neutrons/cm^2/h$. The energy deposited will be 0.15 pC/h.

In the same way as for the calculation in a space environment, each energy proton between 1 and 10 MeV will deposit between 0.04 pC and 0.4 pC with an efficiency of 15%, or 0.006 pC and 0.06 pC. The proton stream is 7 $protons/cm^2/h$, which corresponds to a charge deposit of 0.4 pC/h.

A muon has a low Linear Energy Transfer [LET], considered as constant, and equal to 0.017 fC/µm and an infinite path. It will deposit an average charge in the diode of 1.3 fC. The muon stream at 12 km is 300 $muons/cm^2/h$. The charge deposited by the muons is 0.4 pC/h.

To amplify the generation of current, a doped semiconductor, such as boron doped silicon, can be used. The thermal neutrons are neutrons with kinetic energy less than 0.625 eV and are naturally present in the atmospheric environment. These neutrons have an efficient macroscopic nuclear interaction section that is very high with the Boron10 (3,838 barns [b]), which represents 20% of the natural boron. Exposed to thermal neutrons, the Boron10 can release alpha particles of 1.47 MeV (path 5.21 µm and LET=12 fC/µm) and Lithium, of 0.84 MeV (path 2.5 µm and LET=23 fC/µm). The average energy deposited by nuclear reaction is 0.015 pC and the thermal neutron stream at 12 km is about 5,000 $neutrons/cm^2/h$. The probability of a nuclear reaction with the Boron10 for a boron concentration of 1exp21 $atoms/cm^3$ and a thickness of 500 µm is 0.04. Consequently, the charge deposited by the thermal neutrons will be 3 pC/h. The total charge deposited in the diode is then about 4 pC/h for a polarized diode, which corresponds to power of 4 $pW/cm^2$. The most significant contribution is that associated with the reaction of thermal neutrons with the Boron10.

This power allows the production of 1 mW over 1 ms at a voltage of 1V every 70 hours. To increase the power, it is possible to place several batteries in series or to use diodes with larger surface area.

The electronic effect described is different from the photoelectric effect. This latter effect represents the issue of electrons by a material where it is exposed to the light or to electromagnetic radiation of sufficiently high frequency, which depends on the material.

Figure 6:
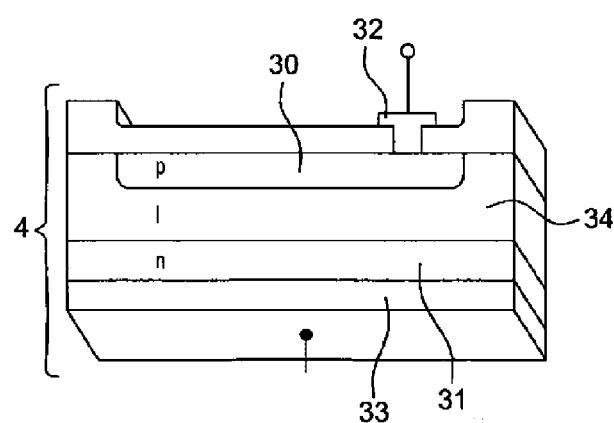
FIG. 6: a section showing a semiconductor junction.

The cells in the invention consist of semiconductors, mainly silicon (Si) based or other semiconductor base, such as cadmium sulphur (CdS), (InSb), cadmium telluride (CdTe), germanium (Ge), silicon carbide (SiC), etc. They are presented in the form of fine plaques, either round or square, of one centimeter or several dozen centimeters to the side, placed in a sandwich between two metal contacts, with a thickness of the order of one millimeter or more. FIG. 6 shows such a cell. An upper layer (30) of the cell consists of doped n-type silicon. In this layer, there is a quantity of free electrons above a pure silicon layer. The lower layer 31 of the cell consists of doped p-type silicon. This layer has an average quantity of free electrons below a pure silicon layer, and the electrons are connected to the crystalline lattice that, consequently, is negatively charged. At the time of the creation of the p-n junction, the free electrons in the region n go back into the layer p and re-combine with the holes in the region p. Therefore, throughout the whole life of the junction, there is a positive charge in the region n next to the junction (because the electrons have left) and a negative charge in the p region next to the junction (because the holes have disappeared). The whole forms the Space Charge Zone (SCZ) and there is an electrical field between the two, from n to p.

This electrical field makes a diode of the Space Charge Zone, which allows the passage of current in one direction only: the electrons can pass from the region p to the region n, but not the other way; conversely, the holes only pass from n to p. In the invention, by adding the reverse polarity, by connecting the layer 30 to the positive pole of the battery 18 and by connecting the layer 31 to the negative pole of the battery 18, the thickness of the Space Charge Zone is increased. The particles crossing this zone, normally in its plane, therefore have a further path to travel in which they are able to create more numerous electron-hole pairs.

In operation, when a particle extracts an electron from the matrix, creating a free electron and a hole, under the effect of this electrical field, they each part in the opposite direction: the electrons accumulate in the n region, whilst the holes accumulate in the doped p layer, creating the pulse 12. This phenomenon is more effective in the Space Charge Zone where there are practically no more charge carriers (electrons or holes) since they are annihilated, or in the immediate proximity of the Space Charge Zone: where a charged particle creates an electron-hole there, they separate and have little chance of meeting their opposite, whilst if the creation takes place further away from the junction, the new electron (respectively the hole) has a greater chance of re-combining before reaching the zone n (respectively, the zone p). The electrical contacts 32 and 33 in the invention do not need to let light pass through. In the invention, with the battery 18, the size of the sensitive zone is increased without risk of re-combination.

Cell 4 is of monocrystalline silicon or in any other semiconductor material and preferably includes an intermediate zone 34 of intrinsic semiconductor to form a PIN diode.

Therefore, with the invention, an electric generator is produced that is sensitive to particle cosmic radiation by mounting a reverse polarized diode in parallel between a reverse polarized battery and a pulse transformer or with a pulse transformer only. In this way, a generator can be created preferably mounted directly onto a printed circuit board which receives a remote sensor.

The invention claimed is:

1. An electric generator, comprising an electronic device with a reverse polarized or non-polarized semiconductor junction device; without any radioactive isotope and a pulse transformer connected to the electronic device; and wherein the electric generator is excited by ionizing radiation originating outside the electric generator to transform the ionizing radiation into electricity.

2. The generator of claim 1, further comprising an attached device to polarize the reverse polarized or non-polarized semiconductor junction device depending on the use of the electric generator.

3. The generator of claim 1, wherein the pulse transformer comprises a converter to transform a current pulse into a voltage.

4. The generator of claim 1, further comprising a condenser mounted in series between the electronic device and the pulse transformer.

5. The generator of claim 1, wherein the electronic device with the reverse polarized or non-polarized semiconductor junction device being mounted on an electronic circuit board of a sensor; and wherein the electric generator supplies power to the sensor.

6. The generator of claim 5, wherein the electronic device with the reverse polarized or non-polarized semiconductor junction device is a diode.

7. The generator of claim 6, wherein the diode is a PIN diode.

8. The generator of claim 5, wherein the electronic device with the reverse polarized or non-polarized semiconductor junction device is contained in a case shielded from photonic radiation.

* * * * *